(12) United States Patent
Ranjan et al.

(10) Patent No.: US 10,268,585 B2
(45) Date of Patent: Apr. 23, 2019

(54) MEMORY CONTROLLER THAT FORCES PREFETCHES IN RESPONSE TO A PRESENT ROW ADDRESS CHANGE TIMING CONSTRAINT

(71) Applicant: Intel Corporation, Santa Clara, CA (US)

(72) Inventors: Ashish Ranjan, West Lafayette, IN (US); Vivek Kozhikkottu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/195,887

(22) Filed: Jun. 28, 2016

(65) Prior Publication Data

US 2017/0371791 A1   Dec. 28, 2017

(51) Int. Cl.
*G06F 12/08*   (2016.01)
*G06F 12/0862*   (2016.01)
*G06F 12/0842*   (2016.01)
*G06F 12/0866*   (2016.01)

(52) U.S. Cl.
CPC ...... *G06F 12/0862* (2013.01); *G06F 12/0842* (2013.01); *G06F 12/0866* (2013.01); *G06F 2212/1016* (2013.01); *G06F 2212/312* (2013.01); *G06F 2212/602* (2013.01); *G06F 2212/6022* (2013.01); *G11C 2207/107* (2013.01)

(58) Field of Classification Search
CPC .......... G06F 12/0862; G06F 2212/602; G06F 12/0866; G06F 12/0842; G06F 2212/1016; G06F 2212/6022; G06F 2212/312
USPC ........................................................ 711/137
See application file for complete search history.

(56) References Cited

U.S. PATENT DOCUMENTS

2015/0200002 A1* 7/2015 Lin ...................... G11C 7/1072
                                                                      711/106
2016/0378668 A1* 12/2016 Roberts ............... G06F 12/0862
                                                                      711/137

* cited by examiner

*Primary Examiner* — Hua J Song
(74) *Attorney, Agent, or Firm* — Compass IP Law PC

(57) ABSTRACT

An apparatus having a memory controller is described. The memory controller includes prefetch circuitry to prefetch, from a memory, data having a same row address in response to the memory controller's servicing of its request stream being stalled because of a timing constraint that prevents a change in row address. The memory controller also includes a cache to cache the prefetched data. The memory controller also includes circuitry to compare addresses of read requests in the memory controller's request stream against respective addresses of the prefetched data in the cache and to service those of the requests in the memory controller's request stream having a matching address with corresponding ones of the prefetched data in the cache.

20 Claims, 8 Drawing Sheets

MEMORY CONTROLLER THAT FORCES PREFETCHES IN RESPONSE TO A PRESENT ROW ADDRESS CHANGE TIMING CONSTRAINT

STATEMENT OF GOVERNMENT RIGHTS

This invention was made with Government support under contract number B608115 awarded by the Department of Energy. The Government has certain rights in the invention.

FIELD OF INVENTION

The field of invention pertains generally to computing system memory technology, and, more specifically, to a memory controller that forces prefetches in response to a present row address change timing constraint.

BACKGROUND

System memory is an important region of the overall performance of a computing system. Generally, the more responsive system memory is to the requests of the components/requestors that issue read and write requests to the system memory, the better the computer's overall performance will be. As such, designers are interested in improving a system memory's ability to respond to the requests that it receives.

FIGURES

A better understanding of the present invention can be obtained from the following detailed description in conjunction with the following drawings, in which:

FIG. 4 shows a prior art system memory address;

DETAILED DESCRIPTION

One way to improve the efficiency of system memory is to find ways to actually use its constituent memory devices during moments of time when the memory devices would otherwise be idled. Here, owing to the complex set of signals and timings that are commonly associated with a memory bus that resides between a memory controller and system memory devices, from time-to-time certain periods of "dead time" exist when a memory device is not able to physically respond to certain kinds of memory requests.

Computers having multiple processing cores may unfortunately regularly experience such dead time periods. Here, a processing core may concurrently execute multiple software threads where each software thread corresponds to a unique instruction stream. Each instruction stream may furthermore operate out if its own set of memory pages. Here, as is understood in the art, instruction streams include memory read and memory write requests that each include a respective system memory address that identifies the location in system memory where data is to be read from (in the case of a memory read) or written to (in the case of a memory write).

Typically, one or more ranges of physical address space in system memory is allocated to a software thread for the storing of its instructions and data in system memory. The instruction and data content of the one or more physical address space ranges are typically stored on a plurality of memory pages that are moved between system memory and non volatile mass storage (e.g., a solid state disk or hard disk drive) in accordance with the needs of the software thread.

In particular, when a thread needs to execute out of a certain address range of its constituent instructions or needs access to data within a particular address range, a page of the corresponding instructions or data is called up from mass storage and loaded into system memory. In the reverse direction pages of instruction or data content can be pushed down from system memory to deeper storage (e.g., when the software thread no longer needs the instructions or data).

By their nature systems that concurrently execute large numbers of software threads, such as systems having a plurality of multi-threaded processing cores, concurrently attempt to access large numbers of different pages within system memory. That is, assuming each active software thread has at least one of its pages loaded in system memory at any time and regularly issues read/write requests to its corresponding page(s), system memory will be under the burden of concurrently receiving requests that collectively target all of the different pages. Said another way, a long run length of system memory requests are bound to target different pages, and different pages will often be accessed before a same page is accessed twice.

Figure 1A:
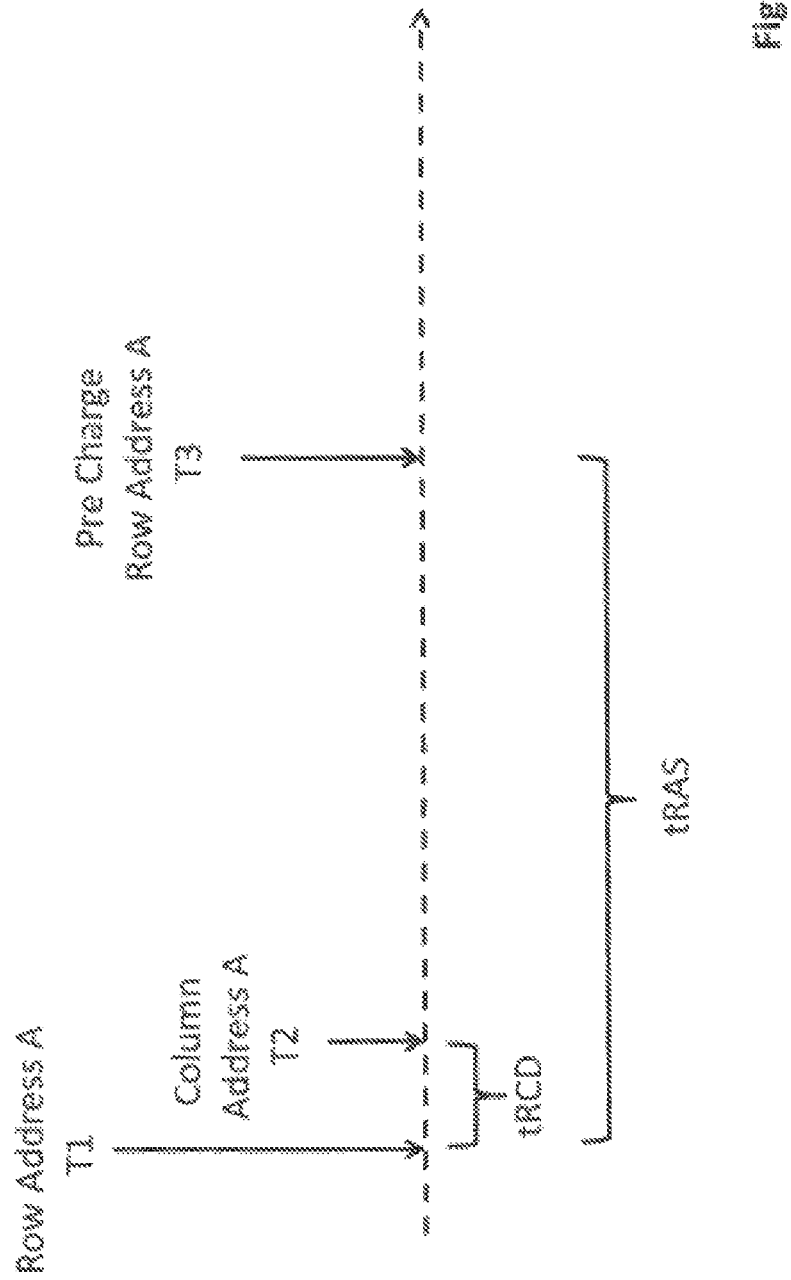
FIGS. 1a, 1b and 1c show prior art row address change sensitive timing constraints of a memory device.
Figure 1B:
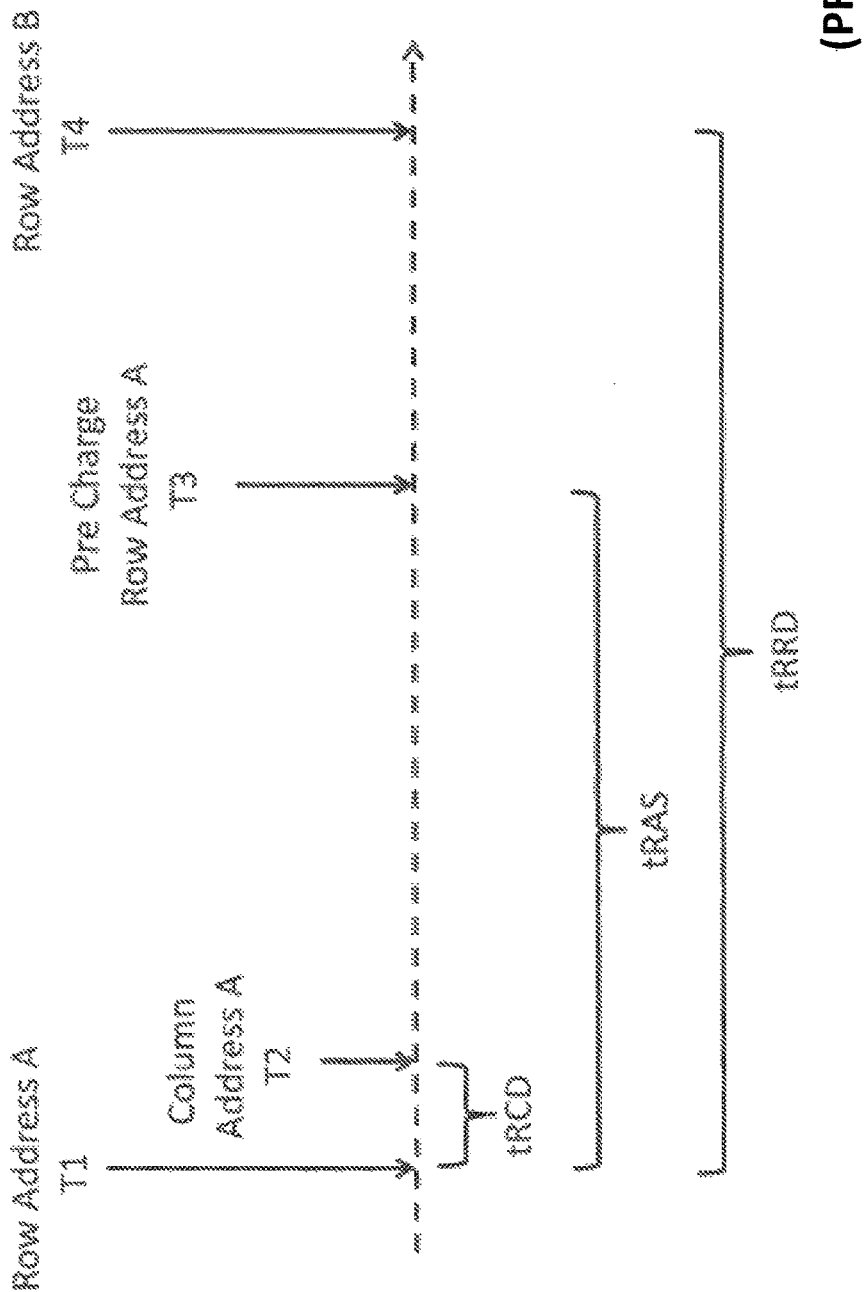
Figure 1C:
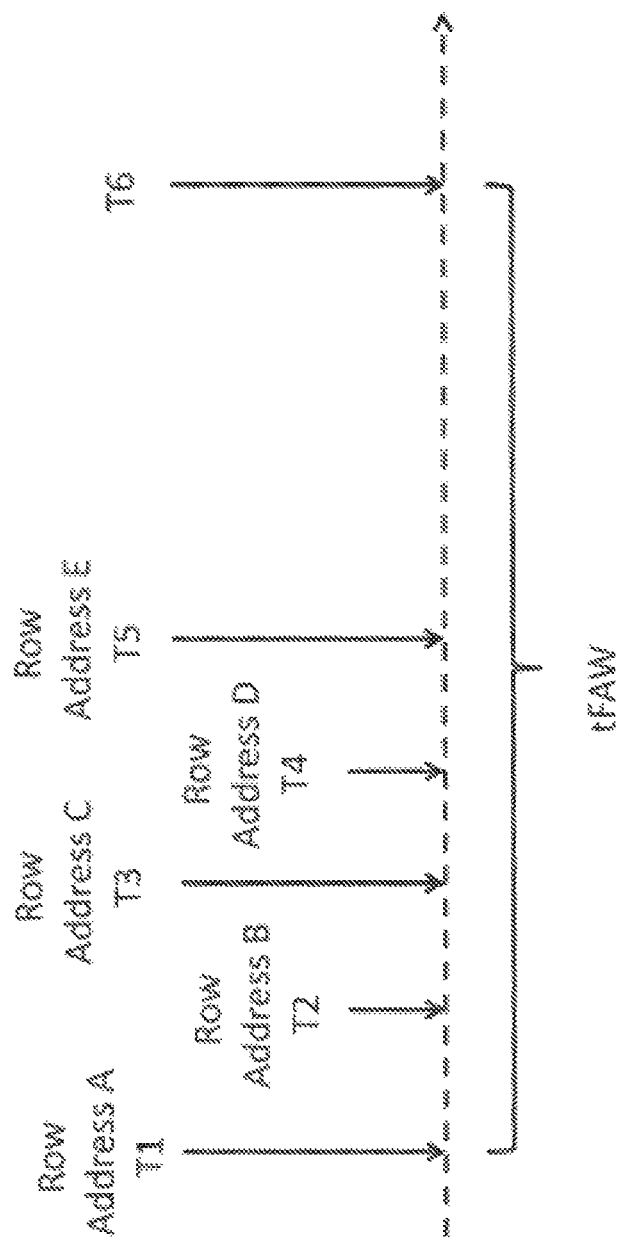

In this kind of environment certain signal timing requirements of the system memory's memory devices can result in a high occurrence of undesirable dead time in which the devices are not actively reading or writing data. In particular, some memory timing requirements are sensitive to whether the same page is being targeted by consecutive memory access requests or if different memory pages are being targeted by consecutive memory access requests. FIGS. 1a through 1c show some specific examples.

FIG. 1a shows the timing associated with the Row Activate to Precharge delay (tRAS). According to various embodiments many different pages in the system will have a different row address. Thus, if a first memory request targets a first page and a second memory request targets a second different page, the first and second requests will often include different row addresses components of their respective system memory addresses. However, the performance specifications of various memory devices (such as various Joint Electron Device Engineering Council (JEDEC) Solid State Technology Association specifications such as various Double Data Rate (DDR) specifications that may be found at www.jedec.org) specify a limitation on how rapidly the row address of a memory device can be changed.

FIG. 1a shows one such restriction in detail. Here, if a first row address A for a first page is generated at time T1 (referred to as an "Activate"), the row address can begin to be changed only after an amount of time tRAS passes. Here, a row address change commences with the pre-charge of the row that is being closed. Thus, tRAS extends from T1 to the time T3 that the pre-charge signal is issued for the first row address A. The second row will become accessible sometime after T3 (i.e., after the first row is foreclosed with the issuance of the pre-charge command at time T3).

Here, tRAS extends across a number of clock cycles that can be used to access a number of different memory locations having the same first row address A. However, in an environment where consecutive memory requests target different memory pages, a large extent of the tRAS time period is consumed by the memory device being idle. Here, the first request is not issued until both the row and column address components of address A are presented on the memory bus. FIG. 1a shows the latest time T2 beyond T1 at which the column address for address A can be presented on the memory bus (which is specified by the Row address strobe (RAS) to Column address strobe (CAS) Delay tRCD).

However, if an immediately following second request targets a different page and invokes a different row address, the memory device must sit idle after the issuing of the first request (which occurs approximately at time T2) until the precharge command that forecloses the first row address can be issued at time T3. Here, it is pertinent to note that if the first request that issues approximately at time T2 was followed by more requests having row address A, the time span between times T2 and T3 could be consumed servicing such requests. That is, because such requests would not change the row address, they could be issued before the precharge command at time T3.

FIG. 1b shows another timing constraint, referred to as the Activate to activate delay (tRRD), that sets a minimum time span between the application of consecutive, different row addresses. Here, again, if the memory request stream is composed of frequent row address changes because the targeted memory pages are frequently changing, the activate to activate delay limit tRRD can cause extended periods of memory device idleness. FIG. 1b shows an extension of the example of FIG. 1a where the row address strobe for the second request having row address B is observed at time T4.

Here, in the case of consecutive requests that have different row addresses, not only will the memory device not service any memory read or write requests from T2 to T3 as discussed above with respect to FIG. 1a, but will continue to not service any memory read or write requests from T3 to T4 on account of the activate to activate delay tRRD. Again, if the row address did not change at time T4 and instead the request stream contained a constant string of requests having the first row address A that was specified at time T1, the memory device could satisfy such requests from T2 to times beyond T3 or even T4.

FIG. 1c shows another timing constraint, referred to as the activate window (tFAW), that limits the number of row address strobes that can be issued to a same memory rank (a rank, as is understood in the art, is a number of memory devices that are coupled to a same chip select (CS) signal). For example, tFAW may set a time window in which a maximum of only four or five different row addresses can be applied to a same rank. Similar to the discussions of FIGS. 1a and 1b, limiting frequent issuance of different row addresses will result in a memory device's inability to service memory read or write requests if the read/write request stream itself is frequently changing the row address (which, again, is apt to happen if the request stream is frequently changing which page is being accessed).

Here, referring to FIG. 1c, assuming an activate window limit (such as a Five Activate Window (tFAW)) that limits the number of different row addresses to five in the tFAW time period, if a fifth unique row address is presented at time T5 well before the expiration of the window at time T6, the memory device will not be able to service any further read or write requests if the request stream issues another row address change shortly after the fifth row address change at time T5. In this case, the memory device will spend much of the time period T5-T6 idle as it will not be able to service the sixth address change until after time T6. Again, note that if the row address remains constant for a number of requests that immediately follow the fifth request having row address E, these requests can be serviced by the memory device before time T6 is reached.

Figure 2:
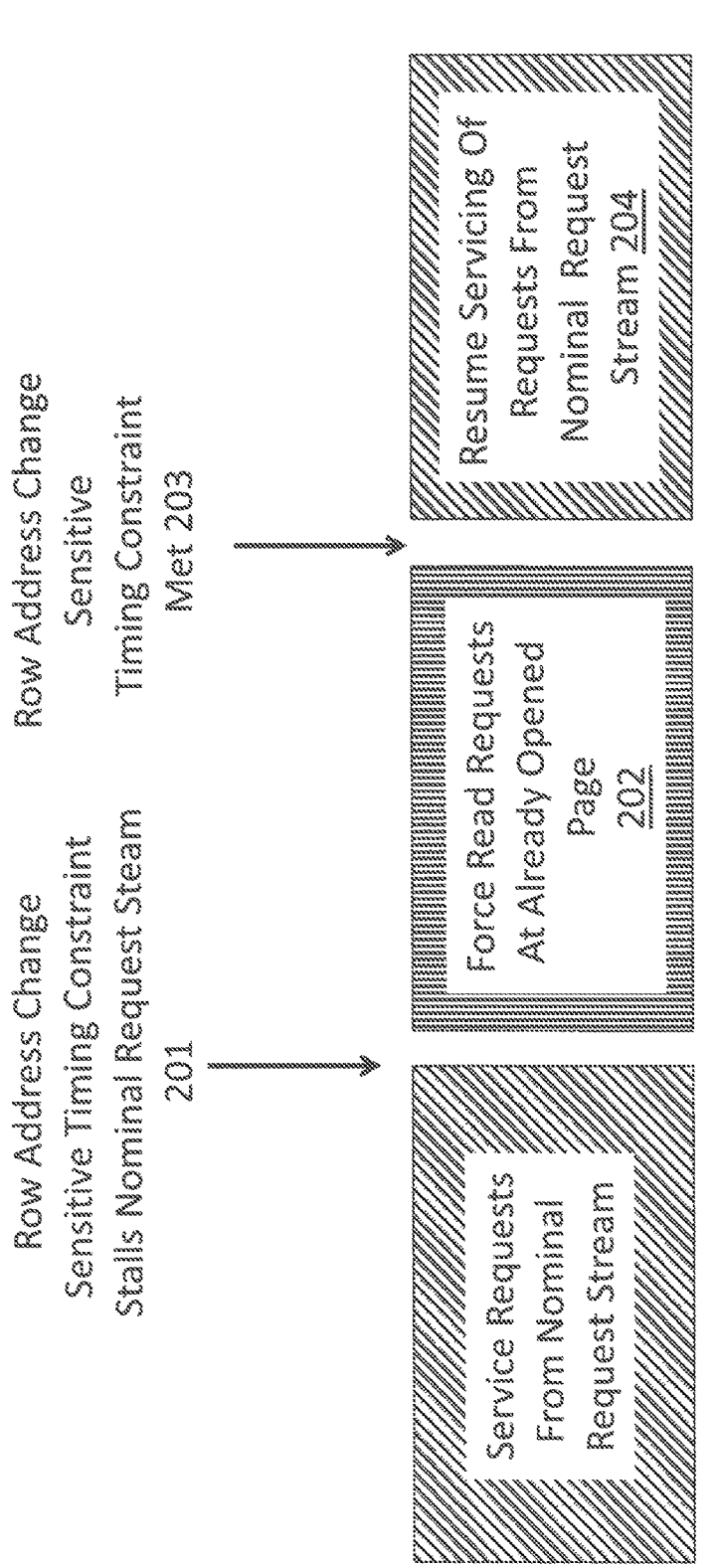
FIG. 2 shows an improved approach that forces prefetches from memory in response to a row address change timing constraint being raised.

FIG. 2 shows a generalized view of an improved approach that should reduce the aforementioned "dead time" periods when a memory device must otherwise sit idle because it is not permitted to change its row address. As observed in FIG. 2, upon recognition of a state 201 in which a next request from the nominal request stream (i.e., requests generated by the system's nominal requestors (e.g., CPU cores, GPU cores, I/O control hub, etc.)) can not be issued because the next request would include a row address change and the timing requirements of the memory device presently do not permit a row address change (such as any of the conditions described above in FIGS. 1a, 1b and 1c), the memory controller automatically forces read requests to be issued 202 where each of the forced read requests have the same row address.

In an embodiment, the forced read requests each have a different overall address such that each forced read request targets a different memory location. For example, the forced requests may each have the same row address but have a different column address (e.g., the memory controller keeps the row address fixed but increments the column address with each next forced read request). Recalling the discussion of memory pages from above, in various embodiments, keeping the row address the same but varying the column address will often correspond to reading different entries from the same currently open page.

When the condition that prevents a row address change is lifted 203 (e.g., because the timing limit discussed above in any of FIGS. 1a, 1b and 1c has been met or surpassed), the memory controller ceases the issuance of forced read requests and reverts back to issuance of requests from the nominal request stream 204.

In an embodiment, the read data from the forced read requests 202 are stored in a local cache within the memory controller. If a subsequent read request in the resumed nominal request stream 204 has an address that matches the address of one of the forced requests, the subsequent read request is serviced with the matching entry in the cache thereby avoiding an actual physical read to memory to service the request. For data consistency reasons, if a subsequent write request in the resumed nominal request stream 204 has an address that matches the address of one of the forced requests, the matching entry is evicted from the local cache and the subsequent write request is issued to memory.

Thus, the forced read requests 202 implement a form of pre-fetching in which read content is fetched from memory before the read content is requested by a requestor such as a software thread. In some embodiments at least, the forced read content is fetched even if there is no guarantee that it will subsequently be requested by a requestor.

Figure 3:
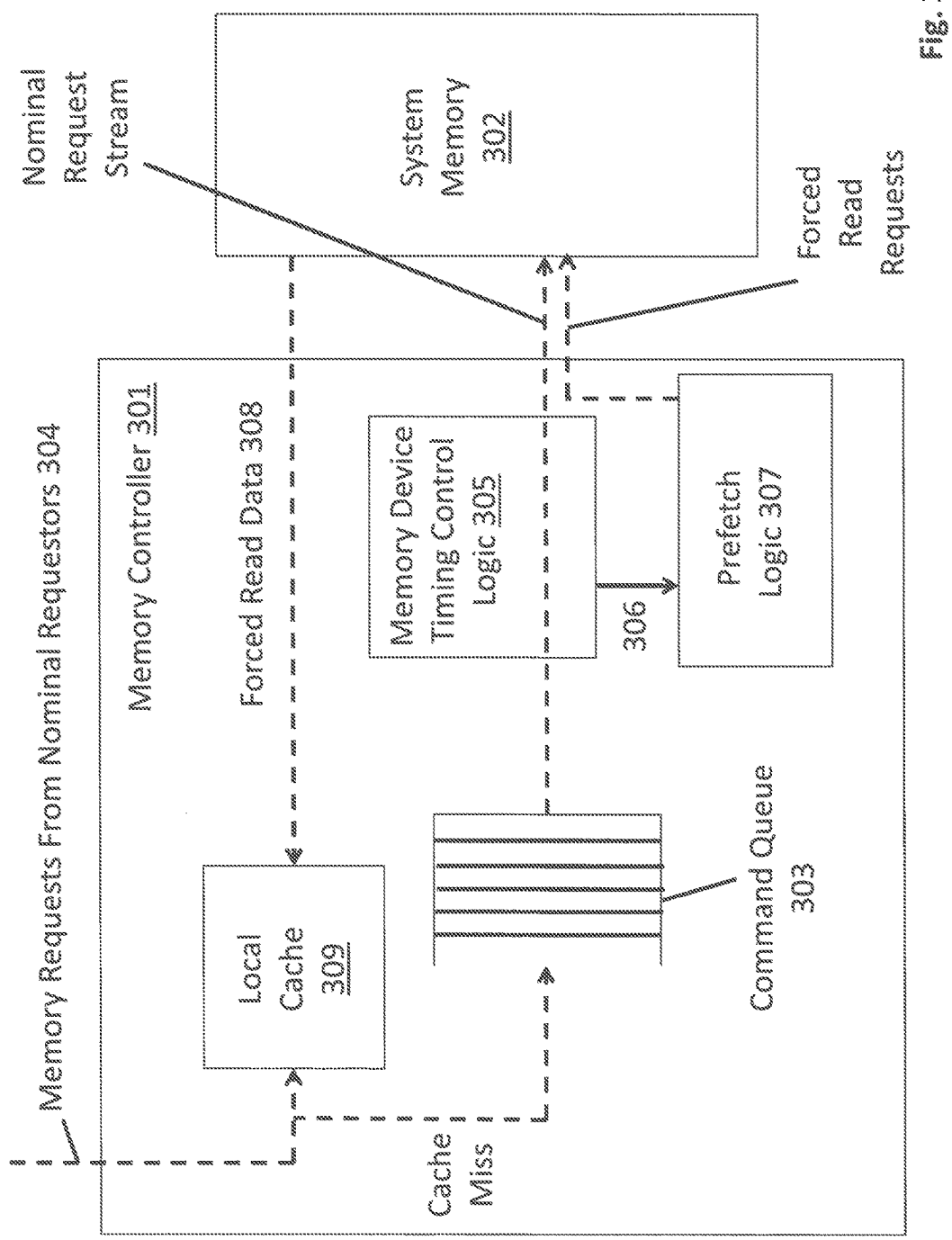
FIG. 3 shows an improved memory controller that forces prefetches from memory in response to a row address change timing constraint being raised.

FIG. 3 shows an embodiment of a memory controller 301 that is designed to force read requests into the memory request stream when the issuance of memory requests is stalled because a next request includes a temporarily prohibited row address change. As observed in FIG. 3 the memory controller 301 includes a command queue 303 which queues the requests 304 that are directed to system memory 302 by the system's nominal requestors. The memory controller 301 also includes memory timing control logic 305 that ensures the memory controller 301 does not offend any of the timing requirements of the memory device(s) within system memory 302.

According to normal operation, read and write requests are issued from the command queue 304 to the memory devices as appropriate and keeping within the memory device's timing requirements. If, however, the memory timing control logic recognizes 305 that a next request in the command queue 304 cannot issue to a memory device because the request's address corresponds to a row address change that will violate a memory timing constraint, a signal 306 is sent to the prefetch logic 307 that triggers the release of one or more forced read requests to system memory 302 that have the same row address as the last prior request from the nominal stream to be serviced before the nominal request stream was stalled.

Again, recalling the memory page discussion from above, in various embodiments, keeping the forced read requests to have a same row address as the last nominal request corresponds to keeping open the particular page that the last nominal request was targeted to. In an embodiment, the memory device timing control logic 305 informs the prefetch logic 307, in some way, of how many forced read requests can/should be issued (e.g., number of forced requests to issue, number of clock cycles that remain until the timing constraint is lifted, etc.). In same or alternative embodiments, where the addresses of the forced pre-fetches are determined by incrementing a column address, the timing control logic 305 also informs the prefetch logic 307 of the column address of the nominal request steam's last request (so that the prefetch logic 307 can build correct prefetch addresses starting from the column address value provided by timing and control logic 305).

While the forced read requests are being issued, the nominal commands in the command queue 303 remain dormant. The read data 308 that is returned from the forced read requests is entered in a local cache circuit 309 along with its corresponding address (or indicator thereof). In various embodiments, the units of the prefetched data items are cache lines and the entries in the local cache hold data in units of cache lines.

Any read request in the command queue 303 having an address that matches the address of a forced read request result is serviced with the forced read response data (i.e., the read data is sent to that request's requestor) and is removed from the command queue 303 if there are no write requests in the command queue 303 having the same address. If any write requests in the command queue 303 have the same address as a prefetched response, the prefetched response is discarded (or no attempt is even made by the prefetch logic 307 to prefetch it).

Upon the timing condition that caused the stall in the nominal request stream being lifted, the forced prefetching activity ceases and nominal requests begin to be issued to system memory from the command queue 303. New requests 304 that are received by the memory controller 301 from the system's various requestors are first checked for a system memory address match with the contents in the local cache 309. If a newly received request does not have an address that matches an entry in the local cache 309 (cache miss), the entry is entered into the command queue 309.

If any newly received read request has a targeted system memory address that matches the address of a read response in the local cache 309 (cache it), the newly received request is serviced from the local cache 309 rather than a physical read to system memory 302. If a newly received write request has an address that matches an entry in the local cache 309, the entry in the local cache 309 is discarded and the newly received write request is entered into the command queue 303.

Logic circuitry within the memory controller (not shown), may include cache hit/miss determination circuitry to determine whether a nominal request has a matching address of a cache entry, servicing logic circuitry to service any such request with the cache contents and eviction circuitry to evict a cache entry having an address that matches that of a nominal write request, forwarding circuitry to forward a nominal request that suffers a cache miss to the memory controller' command queue, and control circuitry to suspend the prefetching activity and restart the servicing of the nominal request queue after the row address sensitive time constraint is no longer an obstacle.

Figure 4:
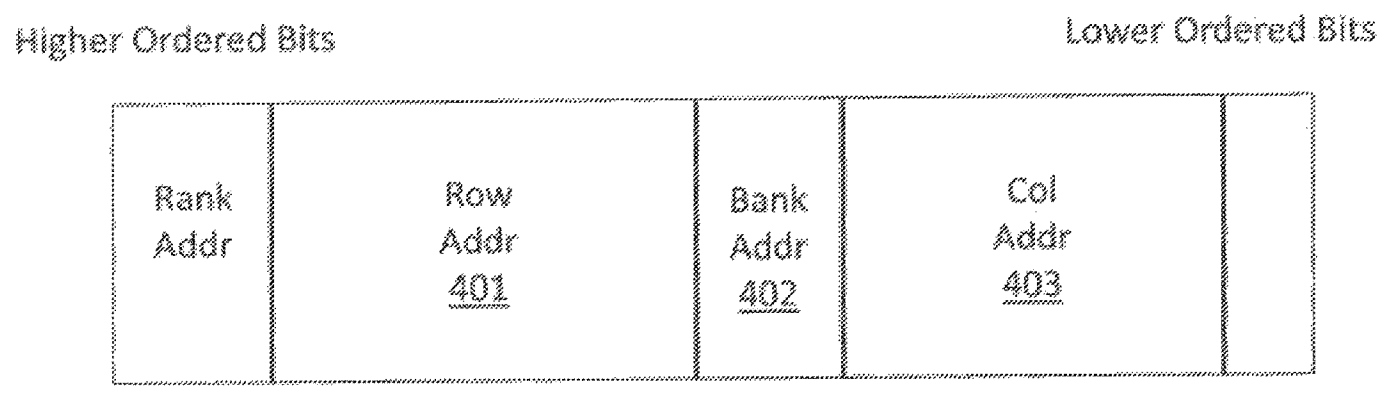

In various embodiments, different pages may have a same row address. For example, the respective system memory addresses of different pages in system memory may share a common row address but have different higher and/or lower ordered bits. FIG. 4 shows a standard breakdown of a system memory address's components. As discussed above, according to one approach, with each new prefetch request address, the row address 401 is held constant but the column address 403 is incremented. In such embodiments, the bank address 402 may also be held constant, or, may be varied depending on implementation.

In embodiments where the bank address 402 is held constant, according to one approach, the bank address 402 keeps the same value as the last issued request from the nominal request stream. In another embodiment, some prior history of bank addresses may be kept by the prefetch logic and used to influence which bank address is to be used for the prefetching activity (e.g., the most commonly used bank history in the recent history of the nominal request stream is used). In embodiments where the bank address 402 is varied, a round robin approach may be utilized to cover a range of bank addresses with a sequence of prefetches, or, some analysis of prior history may be used to target the more commonly accessed banks than the less commonly used banks.

In the various embodiments discussed above, the system memory may be composed of Dynamic Random Access Memory (DRAM) although those of ordinary skill will recognize that any memory having a timing constraint such as a row address change timing constraint can make use of the teachings provided here.

Figure 5:
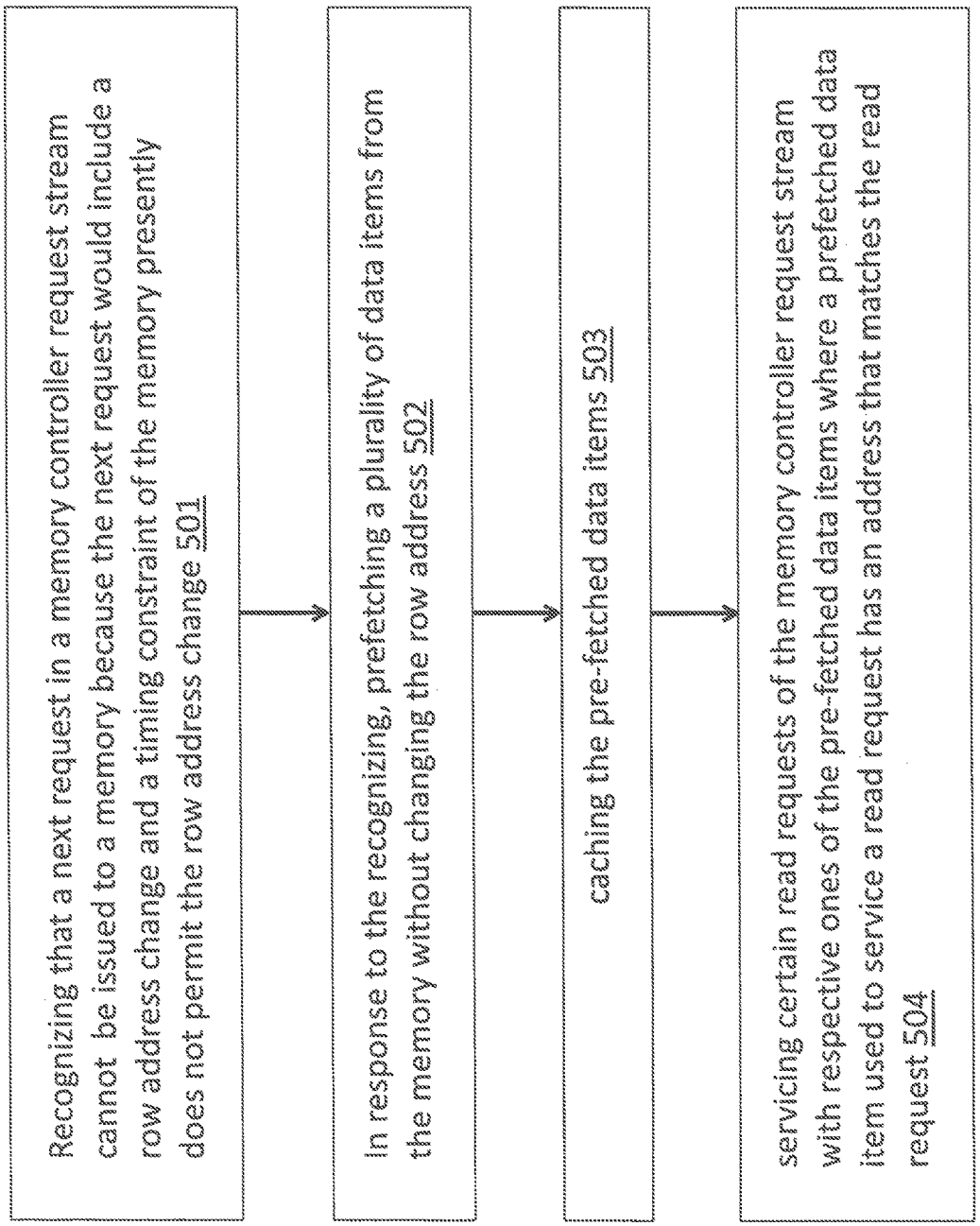
FIG. 5 shows a methodology performed by the improved memory controller of FIG. 3.

FIG. 5 shows a method described above. As observed in FIG. 5, the method includes recognizing 501 that a next request in a memory controller request stream cannot be issued to a memory because the next request would include a row address change and a timing constraint of the memory presently does not permit the row address change. In response to the recognizing, prefetching 502 a plurality of data items from the memory without changing the row address. Caching 503 the pre-fetched data items. And servicing 504 certain read requests of the memory controller request stream with respective ones of the pre-fetched data items where a pre-fetched data item used to service a read request has an address that matches the read request.

Figure 6:
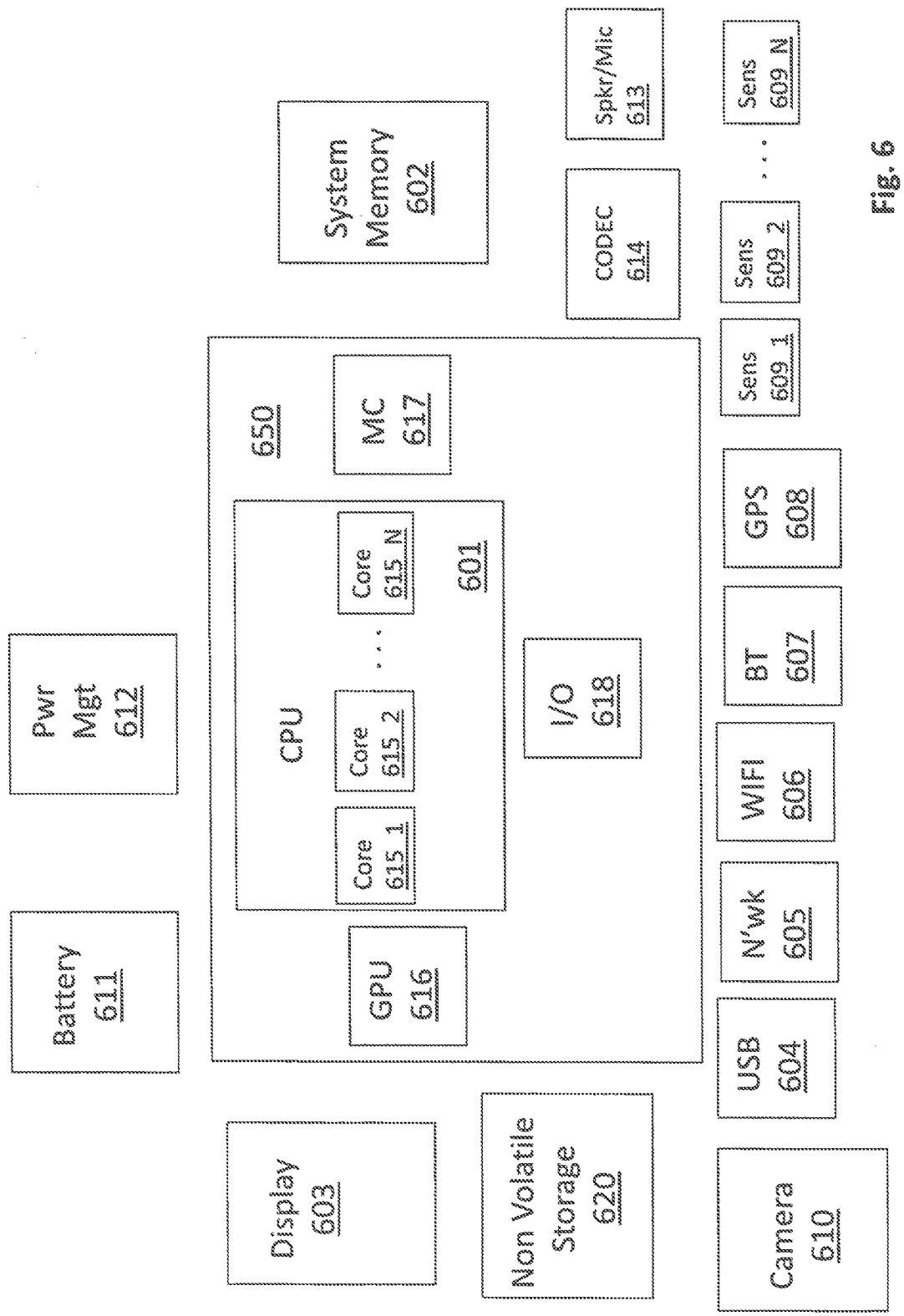
FIG. 6 shows an embodiment of a computing system.

FIG. 6 shows a depiction of an exemplary computing system 600 such as a personal computing system (e.g., desktop or laptop) or a mobile or handheld computing system such as a tablet device or smartphone, or, a larger computing system such as a server computing system. As observed in FIG. 6, the basic computing system may include a central processing unit 601 (which may include, e.g., a plurality of general purpose processing cores and a main memory controller disposed on an applications processor or multi-core processor), system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_N (e.g., one or more of a gyroscope, an accelerometer, a magnetometer, a temperature sensor, a pressure sensor, a humidity sensor, etc.), a camera 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing units 616 typically execute graphics intensive functions to, e.g., generate graphics information that is presented on the display 603.

The memory control function (or memory controller) 617 interfaces with the system memory 602. The memory controller 617 may be designed to prefetch data from system memory 602 in response to recognizing that a next request in the memory controller request stream cannot be issued because a timing constraint of the system memory 602 that is sensitive to row address change would be violated.

Each of the touchscreen display 603, the communication interfaces 604-607, the GPS interface 608, the sensors 609, the camera 610, and the speaker/microphone codec 613, 614 all can be viewed as various forms of I/O (input and/or output) relative to the overall computing system including, where appropriate, an integrated peripheral device as well (e.g., the camera 610). Depending on implementation, various ones of these I/O components may be integrated on the applications processor/multi-core processor 650 or may be located off the die or outside the package of the applications processor/multi-core processor 650.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of software or instruction programmed computer components or custom hardware components, such as application specific integrated circuits (ASIC), programmable logic devices (PLD), digital signal processors (DSP), or field programmable gate array (FPGA).

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a memory controller comprising a), b) and c) below:
a) prefetch circuitry to prefetch, from a memory, data having a same row address in response to the memory controller's servicing of its request stream being stalled because of a row address signaling requirement that prevents a change in row address until a specified time period has elapsed;
b) a cache to cache the prefetched data;
c) circuitry to compare addresses of read requests in the memory controller's request stream against respective addresses of the prefetched data in the cache and to service those of the requests in the memory controller's request stream having a matching address with corresponding ones of the prefetched data in the cache.

2. The apparatus of claim 1 wherein the same row address corresponds to an already open memory page.

3. The apparatus of claim 1 wherein the row address signaling requirement includes any of:
a first requirement that establishes a minimum time between activation of a row address and a subsequent precharge of the row address;
a second requirement that establishes a minimum time between two consecutive different row addresses;
a third requirement that limits a number of row address changes within a time window.

4. The apparatus of claim 1 wherein the prefetch circuitry increments a column address value to articulate different units of the prefetched data.

5. The apparatus of claim 1 wherein the memory controller further comprises circuitry to evict an item of prefetched data having an address that matches an address of a write request within the memory controller's request stream.

6. The apparatus of claim 1 wherein the memory controller further comprises circuitry to forward a request within the memory controller's request stream to a command queue of the memory controller because the request has an address that does not match any addresses of the prefetched data.

7. The apparatus of claim 1 wherein the memory controller further comprises circuitry to restart servicing of the memory controller's request stream and to suspend the prefetch circuit's prefetching activity in response to the row address signaling requirement no longer being an obstacle to the servicing of the memory controller's request stream.

8. A computing system, comprising:
one or more processing cores;
a system memory;
a networking interface;
a memory controller coupled to the system memory, the memory controller comprising a), b) and c) below:
a) prefetch circuitry to prefetch, from a memory, data having a same row address in response to the memory controller's servicing of its request stream being stalled because of a row address signaling requirement that prevents a change in row address until a specified time period has elapsed;

b) a cache to cache the prefetched data;
c) circuitry to compare addresses of read requests in the memory controller's request stream against respective addresses of the prefetched data in the cache and to service those of the requests in the memory controller's request stream having a matching address with corresponding ones of the prefetched data in the cache.

9. The computing system of claim 8 wherein the same row address corresponds to an already open memory page.

10. The computing system of claim 8 wherein the row address signaling requirement includes any of:
   a first requirement that establishes a minimum time between activation of a row address and a subsequent precharge of the row address;
   a second requirement that establishes a minimum time between two consecutive different row addresses;
   a third requirement that limits a number of row address changes within a time window.

11. The computing system of claim 8 wherein the prefetch circuitry increments a column address value to articulate different units of the prefetched data.

12. The computing system of claim 8 wherein the memory controller further comprises circuitry to evict an item of prefetched data having an address that matches an address of a write request within the memory controller's request stream.

13. The computing system of claim 8 wherein the memory controller further comprises circuitry to forward a request within the memory controller's request stream to a command queue of the memory controller because the request has an address that does not match any addresses of the prefetched data.

14. The computing system of claim 8 wherein the memory controller further comprises circuitry to restart servicing of the memory controller's request stream and to suspend the prefetch circuit's prefetching activity in response to the row address signaling requirement no longer being an obstacle to the servicing of the memory controller's request stream.

15. A method, comprising:
   recognizing that a next request in a memory controller request stream cannot be issued to a memory because the next request would include a row address change and a row address signaling requirement of the memory presently does not permit the row address change because a specified time period has not yet elapsed;
   in response to the recognizing, prefetching a plurality of data items from the memory without changing the row address;
   caching the pre-fetched data items; and,
   servicing certain read requests of the memory controller request stream with respective ones of the pre-fetched data items where a prefetched data item used to service a read request has an address that matches the read request.

16. The method of claim 15 wherein the row address used during the prefetching corresponds to an already open memory page.

17. The method of claim 15 wherein the row address signaling requirement includes any of:
   a first requirement that establishes a minimum time between activation of a row address and a subsequent precharge of the row address;
   a second requirement that establishes a minimum time between two consecutive different row addresses;
   a third requirement that limits a number of row address changes within a time window.

18. The method of claim 15 wherein the prefetching comprises incrementing a column address value to articulate different units of the prefetched data.

19. The method of claim 15 further comprising evicting certain ones of the prefetched data having an address that matches write requests of the memory controller's request stream.

20. The method of claim 15 further comprising, in response to the row address signaling requirement being satisfied, ceasing the prefetching, and, servicing the next request.

* * * * *